(12) United States Patent
Chu

(10) Patent No.: US 6,292,086 B1
(45) Date of Patent: Sep. 18, 2001

(54) LATERAL HIGH-Q INDUCTOR FOR SEMICONDUCTOR DEVICES

(75) Inventor: Jerome Tsu-Rong Chu, Orlando, FL (US)

(73) Assignee: Agere Systems Guardian Corp., Orlando, FL (US)

( * ) Notice: Subject to any disclaimer, the term of this patent is extended or adjusted under 35 U.S.C. 154(b) by 0 days.

(21) Appl. No.: 09/416,348

(22) Filed: Oct. 12, 1999

(51) Int. Cl.$^7$ ....................................................... H01F 5/00
(52) U.S. Cl. ........................... 336/200; 336/223; 336/232
(58) Field of Search .................................... 336/200, 223, 336/232

(56) References Cited

U.S. PATENT DOCUMENTS 4,926,292 * 5/1990 Maple ................................... 361/765
5,425,167 * 6/1995 Shiga et al. ............................. 29/606
5,576,680 * 11/1996 Ling ...................................... 336/200

FOREIGN PATENT DOCUMENTS 56 120155    9/1981  (JP) .

OTHER PUBLICATIONS

Ahn et al, A Fully Integrated Planar Toroidal Inductor with a Micromachined Nickel–Iron Magnetic Bar, IEEE Transactions on Components, packaging and manufaturing technolody–Part A, vol. 17, No. 3, Sep. 1994.*

* cited by examiner

*Primary Examiner*—Anh Mai

(57) ABSTRACT

An inductor for a semiconductor device comprises a plurality of loops connected in series and formed along a lateral axis of the semiconductor device. Each loop comprises a bottom leg, a top leg, and a pair of side legs. The bottom legs are parallel and extend along a first plane. The top legs are also parallel and extend along a second plane. The second plane is parallel to and separate from the first plane. The first and second planes are parallel to said lateral axis, and the side legs are perpendicular to the first and second planes. The top and side legs can be formed from copper. A barrier layer between the top legs and a substrate layer adjacent the top legs and between the side legs and the bottom legs and the substrate layer can also be provided. The barrier can be formed from tantalum.

5 Claims, 3 Drawing Sheets

LATERAL HIGH-Q INDUCTOR FOR SEMICONDUCTOR DEVICES

CROSS-REFERENCE TO RELATED APPLICATION

Not Applicable

STATEMENT REGARDING FEDERALLY SPONSORED RESEARCH AND DEVELOPMENT

Not Applicable

FIELD OF THE INVENTION

This invention relates to the manufacturing of semiconductor devices. More specifically, the invention relates to a lateral inductor on a semiconductor device.

BACKGROUND OF THE INVENTION

High-Q inductors are a common feature found on most communications semiconductor devices. The most common method of forming an inductor in a semiconductor device involves depositing thick layers, 3 $\mu$m or greater, of metal on the top layer of circuitry. This top layer is formed in a spiral pattern in conjunction with a special substrate to create a high-Q inductor. This method has the disadvantage in that to create an inductor of 10, an area of typically more than 300 $\mu$m×300 $\mu$m is required. This area subsequently cannot be used for other circuitry due to electromagnetic interference. Additionally, current processing techniques to form these high-Q inductors that use photoresist and copper require two or more mask levels and two or more exposure steps. This processing results in inductors with air gaps that are not compatible with current processing technology.

Previous attempts have been made at creating lateral high-Q inductors on either non-conducting or highly resistive substrates. However, current chip designs prefer highly conductive substrates for latch-up protection. Current versions of high-Q inductors on silicon substrates have been demonstrated with planar spiral inductors in AlCu, but this technology is not compatible with upper level copper metalization.

SUMMARY OF THE INVENTION

It is therefore an object of the invention to provide a high-Q lateral inductor that provide reduced area requirements in a semiconductor device.

It is yet another object of the invention to provide a high-Q lateral inductor that can be used with copper damascene processes.

It is another object of the invention to provide a high-Q lateral inductor that only requires a single mask step.

It is a further object of the invention to provide a high-Q lateral inductor that can be easily modeled using readily available analytical tools.

It is still another object of the invention is to provide a high-Q lateral inductor that is CMOS compatible.

Yet another object of the invention is to provide a high-Q lateral inductor that is compatible with silicon substrates.

These and other objects of the invention are achieved by the subject device comprising a plurality of loops connected in series and formed along a lateral axis of a semiconductor device. Each loop comprises a bottom leg, a top leg, and a pair of side legs. The bottom legs are parallel and extend along a first plane. The top legs are also parallel and extend along a second plane. The second plane is parallel to and separate from the first plane. The first and second planes are parallel to said lateral axis, and the side legs are perpendicular to the first and second planes.

The top and side legs can be formed from copper. If the top and side legs are formed from copper, a tantalum nitride or other copper barrier layer between the top legs and a substrate layer adjacent the top legs and between the side legs and the bottom legs and the substrate layer is preferably provided.

Unless otherwise defined, all technical and scientific terms used herein have the same meaning as commonly understood by one of ordinary skill in the art to which this invention belongs. Although methods and materials similar or equivalent to those described herein can be used in the practice or testing of the present invention, the preferred methods and materials are described below. All publications, patent applications, patents, and other references mentioned herein are incorporated by reference in their entirety. In case of conflict, the present specification, including definitions, will control. In addition, the materials, methods, and examples are illustrative only and not intended to be limiting.

BRIEF DESCRIPTION OF THE DRAWINGS

There are shown in the drawings embodiments of the invention that are presently preferred, it being understood, however, that the invention is not limited to the precise arrangements and instrumentalities shown. Specifically.

FIG. 2 shows the inductor as illustrated in FIG. 1 in a cross-section taken along line 2—2 after bottom legs have been deposited on a substrate.

FIG. 3 shows the inductor as illustrated in FIG. 2 in a cross-section taken along line 3—3 after bottom legs have been deposited on the substrate and after an additional substrate layer is formed over the first substrate.

FIG. 4 shows the inductor as illustrated in FIG. 3 after vias for side legs are defined in the additional substrate layer.

FIG. 5 shows the inductor as illustrated in FIG. 4 after a photoresist is deposited over areas of the additional substrate layer that are not to be reduced.

FIG. 6 shows the inductor as illustrated in FIG. 5 after the thickness of the additional substrate layer has been reduced.

FIG. 7 shows the inductor as illustrated in FIG. 6 after the photoresist has been removed and a barrier layer has been deposited over the additional substrate layer.

FIG. 8 shows the inductor as illustrated in FIG. 7 after deposition of a metal layer.

FIG. 9 shows the inductor as illustrated in FIG. 8 after removal of excess metal.

DETAILED DESCRIPTION OF THE INVENTION

Figure 1:
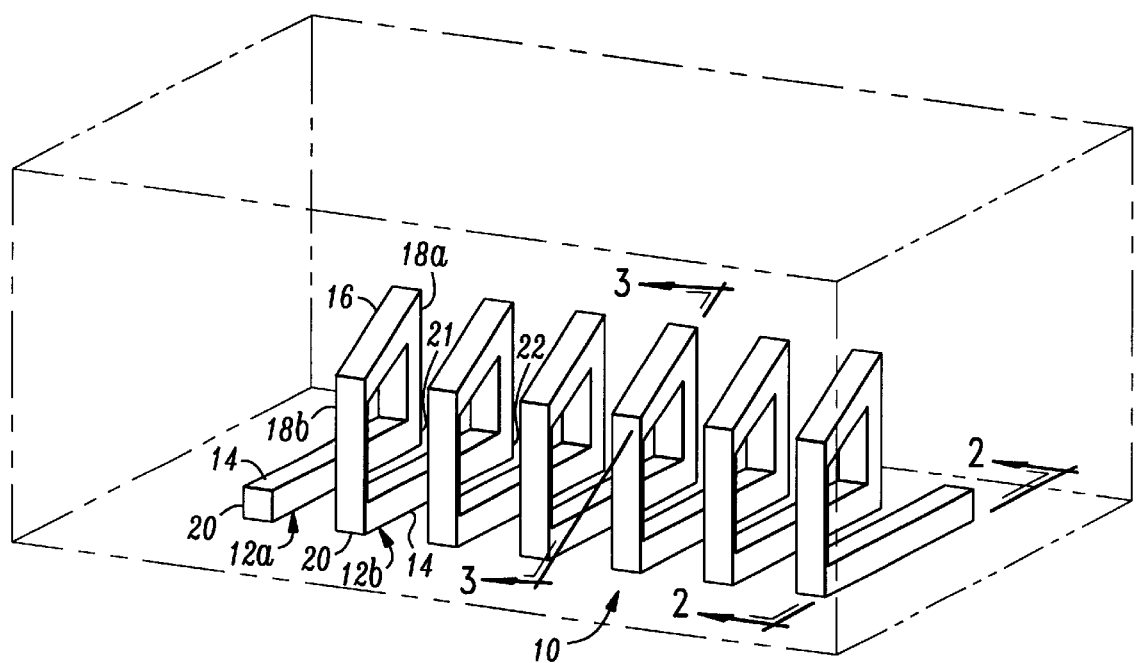
FIG. 1 is a perspective view of an inductor disposed within a semiconductor device according to the invention.

A lateral inductor for a semiconductor device according to the invention is illustrated in FIG. 1. The inductor 10 comprises a plurality of loops 12 connected in series along a lateral axis of the semiconductor device. The number of loops 12 for each inductor 10 is at least one and preferably two at a minimum and has no maximum number. Each loop 12 includes a bottom leg 14, a top leg 16, and a pair of side legs 18a, 18b. Between adjacent loops 12a, 12b, the second side leg 18b of the first loop 12a connects to the bottom leg 14 of the second loop. It being understood, however, the end point of one loop and the starting point of an adjacent loop need not occur between the second leg of the one loop and the bottom leg of the adjacent loop. Instead, the end point of one loop and the starting point of an adjacent loop can be at any point along the loop.

Although the bottom legs 14 of the inductor 10 can be oriented at any angle relative to one another, the bottom legs 14 of the inductor 10 preferably extend parallel to one another along a common plane. Positioning the bottom legs 14 parallel to one another and along a common plane allows for ease of manufacturing. The length of each bottom leg 14 can vary from one bottom leg 14 to the other; however each bottom leg 14 preferably have a common length for ease of manufacturing.

Each bottom leg has a first distal end 20 and an opposing second distal end 22. The bottom legs 14 are not limited as to a minimum or maximum length. Additionally, the bottom legs 14 are not limited as to a particular cross-section; however, as the cross-section of the bottom legs 14 increases the resistance of the inductor 10 decreases and the inductance increases.

Although the bottom legs 14 are not limited as to a distance between adjacent bottom legs 14, however the distance between adjacent bottom legs 14 determines the distance between adjacent loops 12a, 12b. As the loops 12a, 12b become closer, an inductor 10 with a higher Q and inductance is provided. Typically, these are desired characteristics.

First and second side legs 18a, 18b are respectively formed between adjacent and connected loops 12a, 12b. The first side leg 18a extends from the first distal end 20 of the bottom leg 14 of the first loop 12a, and the second side leg 18b extends from the second distal end 22 of the bottom leg 14 of the second loop 12b. Although the side legs 18a, 18b can respectively extend in any direction from their respective bottom legs 14, the side legs 18a, 18b preferably extend substantially perpendicular from the bottom legs 14. Orienting the side legs 18a, 18b perpendicular to the bottom legs 14 provides ease of manufacturing and provides for better inductor characteristics of inductance and quiescence.

The side legs 18 are not limited as to a particular length; however, the side legs are preferably about the same length as each bottom leg 14. Providing square loops would provide a structure whose characteristics are easier to model.

A top leg 16 extends between the first side leg 18a and the second side leg 18b of adjacent connected loops 12a, 12b. Although the top legs 16 of the inductor 10 can be oriented at any angle relative to one another, the top legs 16 of the inductor 10 preferably extend parallel to one another along a common plane. Positioning the top legs 16 parallel to one another and along a common plane allows for ease of manufacturing. The length of each top leg 16 can vary from one top leg 16 to the other; however each top leg 16 preferably have a common length for ease of manufacturing.

In a preferred embodiment, the top legs 16 are parallel and extend along a common plane, and the bottom legs 14 are parallel and extend along a common plane. In such an embodiment, the top legs 16 can be oriented in any manner relative to the bottom legs 14. However, in a most preferred embodiment, the plane containing the top legs 16 is parallel to and separate from the plane containing the bottom legs 14. This orientation is preferred because this structure has characteristics easier to model. Also, the processing of structure is easier to control.

The inductor 10 will typically be connected to other features in the semiconductor device. Any means of connection between the inductor 10 and these other features are acceptable for use with the invention. Also, the invention is not limited as to the location of the connection. For example, the connection can be at the top legs 16, bottom legs 14, or at the side legs 18a, 18b.

Figure 2:
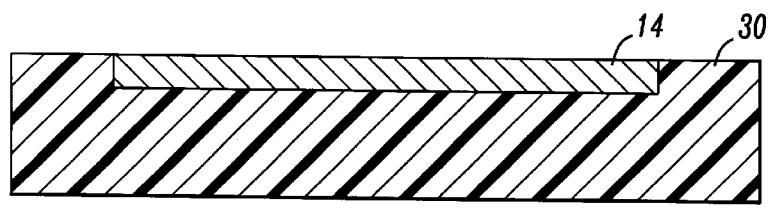
FIGS. 2 through 9 are cross-sectional views illustrating a sequence of steps involved in the method of forming an inductor in a semiconductor device.

In a second embodiment of the invention, a method is disclosed for manufacturing in a semiconductor device the lateral inductor illustrated in FIG. 1. In FIG. 2, the bottom legs 14 are first formed on a dielectric substrate 30. Many types of dielectric substrates 30 are known in the art, and this invention is not limited as to a particular dielectric substrate 30.

The bottom legs 14 can be formed from any conductor, for example Al alloy, Cu, W, doped crystalline polysilicon, and tungsten silicide. Many processes are well known in the art of semiconductor manufacturing that are capable of providing bottom legs 14 on a substrate, and this invention is not limited as to a particular process. Examples of such methods include electroplating, deposition and etchback with photolithographic patterning, and damascene processing. However, the presently preferred method of forming the bottom legs 14 is deposition and then etchback with photolithographic patterning. This process is commonly used in semiconductor manufacturing, and provides easily controlled characteristics with minimum feature sizes.

Figure 3:
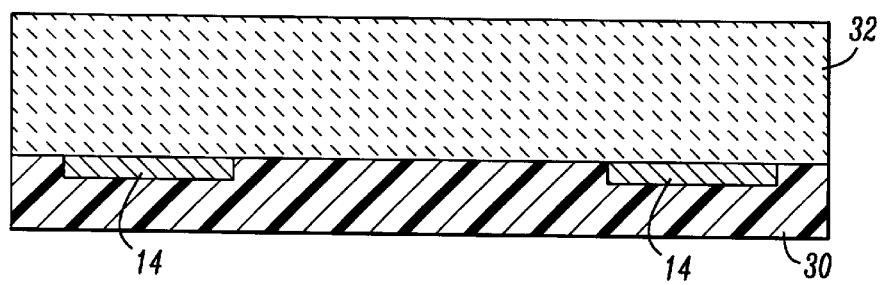

As illustrated in FIG. 3, once the bottom legs 14 have been formed, an additional layer 32 is formed over the substrate layer 30. The substrate can be formed from a variety of materials, for example, silicon nitride, silicon oxide or tantalum pentoxide as is well known in the art; however, the presently preferred substrate is formed with silicon oxide. The thickness of the substrate typically varies according to overall semiconductor device design criteria. A typical range, however, for the substrate layer is approximately 8000 Å to 10,000 Å. It being understood that this range is illustrative only and is not intended to be limiting.

Typical methods of applying the substrate layer include plasma enhanced chemical vapor deposition (PECVD), high-density plasma deposition (HDP), metalorganic CVD (MOCVD), molecular beam epitaxy (MBE), physical vapor deposition (PVD), sputtering deposition, and chemical vapor deposition (CVD). Depositing silicon oxide using HDP is advantageous because of the process's relatively low operating temperatures as compared to the CVD process. Also, HDP silicon oxide exhibits better gap-fill properties as compared to CVD oxide.

Alternatively, the substrate can be formed with borophosphosilicate glass (BPSG), a phosphosilicate glass (PSG), a glass formed from phosphorous and/or boron-doped tetraethyl orthosilicate (TEOS), spin-on glass or other low dielectric constant films, examples of which include polymers, nano-porous glass and hydrogen silsesquioxane.

The thickness of the additional substrate layer 32 should be as thick as the desired perpendicular distance between the bottom legs 14 and the top legs 16. If the thickness of the additional substrate layer 32 is greater than the desired perpendicular distance, then the additional substrate layer 32 will have to be subsequently etched back to the desired distance.

Figure 4:
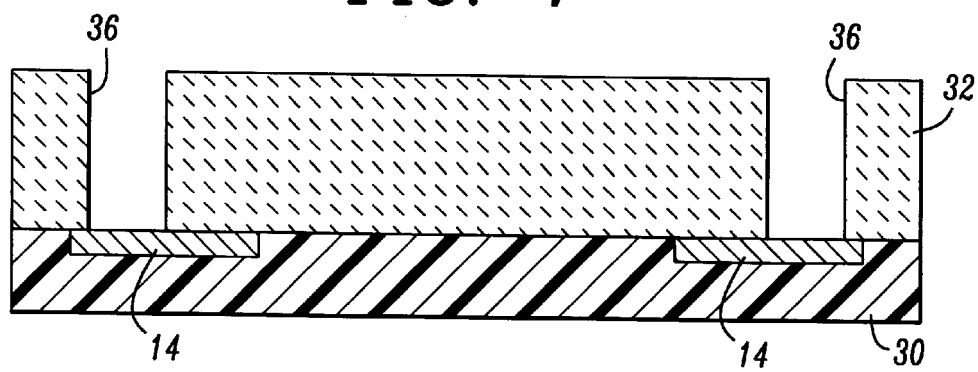

As illustrated in FIG. 4, vias 36 for the side legs 18a, 18b are defined in the additional substrate layer 32. Many processes are well known in the art of semiconductor manufacturing that are capable of etching a via into a substrate, and this invention is not limited as to a particular process. Examples of such include chemical mechanical polishing, plasma etching, and chemical etching.

Upon forming the vias 36 in the additional substrate layer 32, if the thickness of the substrate layer is greater than the desired perpendicular distance between the bottom legs 14 and the top legs 16, the thickness of the additional substrate layer 32 must be reduced. Many processes are well known in the art of semiconductor manufacturing that are capable of reducing the thickness of a substrate layer, and this invention is not limited as to a particular process. Examples of such processes include chemical mechanical polishing, plasma etching, and chemical etching.

Figure 5:
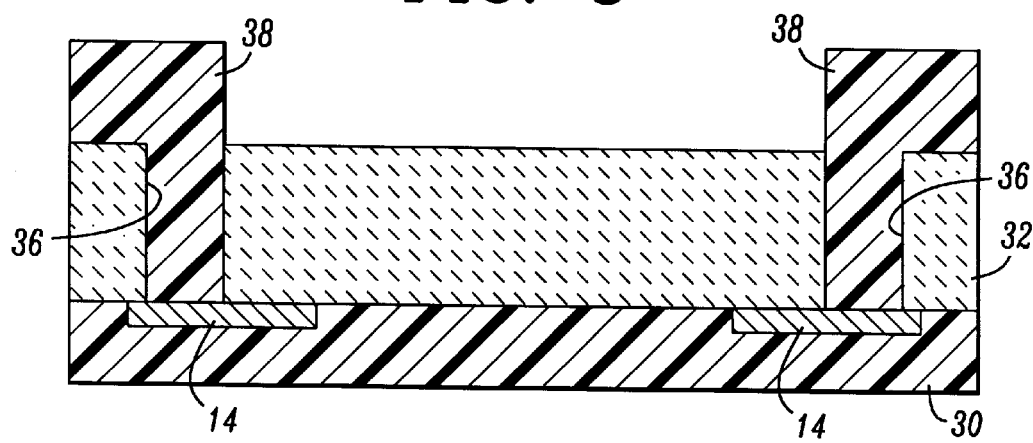
Figure 6:
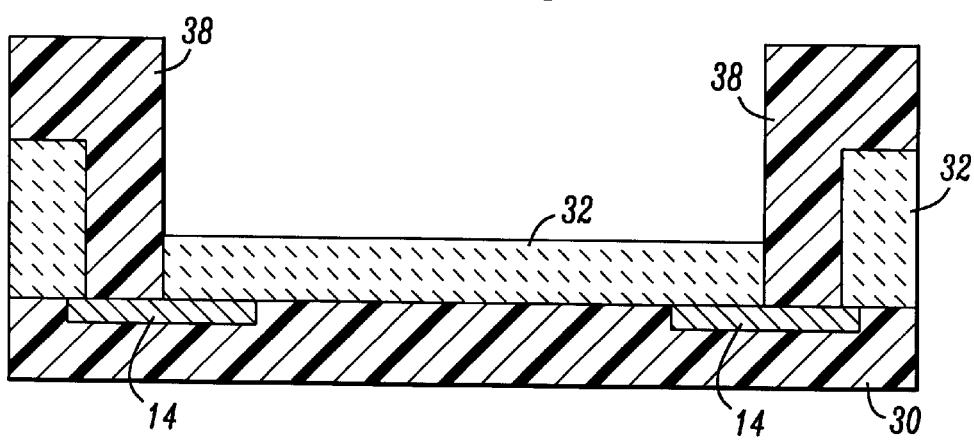

In reducing this thickness, however, the vias 36 must not be filled with any residual material. FIGS. 5 and 6 illustrate the preferred process for reducing the thickness of the additional substrate layer 32. First, a photoresist 38 covers all the areas not to be reduced, which includes the vias 36. After the photoresist 38 is applied, the thickness of the additional substrate 32 is reduced to the desired thickness by anisotropically etching the additional substrate 32 with a selective etch. Anisotropic etching is characterized as being highly directional. Also, anisotropic etching is highly selective depending on such factors as etching ions, ambient gases, RF power level, frequency, and crystalline orientation. Importantly, this process is capable of using gas plasma sources to etch in a vertical direction only. Once the etching has been completed, the photoresist is removed.

Once the additional substrate 32 is at the desired thickness, the side legs 18a, 18b and the top legs 16 are formed as a monolithic element by depositing a conductive material 42 in the vias 36 and on top of the additional substrate layer 32 in a single process step. The side legs 18a, 18b and the top legs 16 can be formed from any conductor, for example Al alloy, Cu, W, doped crystaline polysilicon, and tungsten silicide. Many processes are well known in the art of semiconductor manufacturing that are capable of depositing a conductor in a via and on top of a substrate layer in a single process step, and this invention is not limited as to a particular process. Examples of such processes include metal slab deposition via sputtering, physical vapor deposition, chemical vapor deposition, and direct electroplating.

Figure 7:
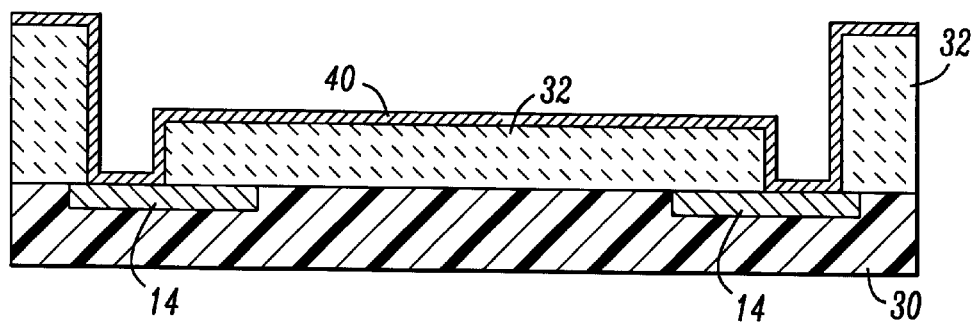
Figure 8:
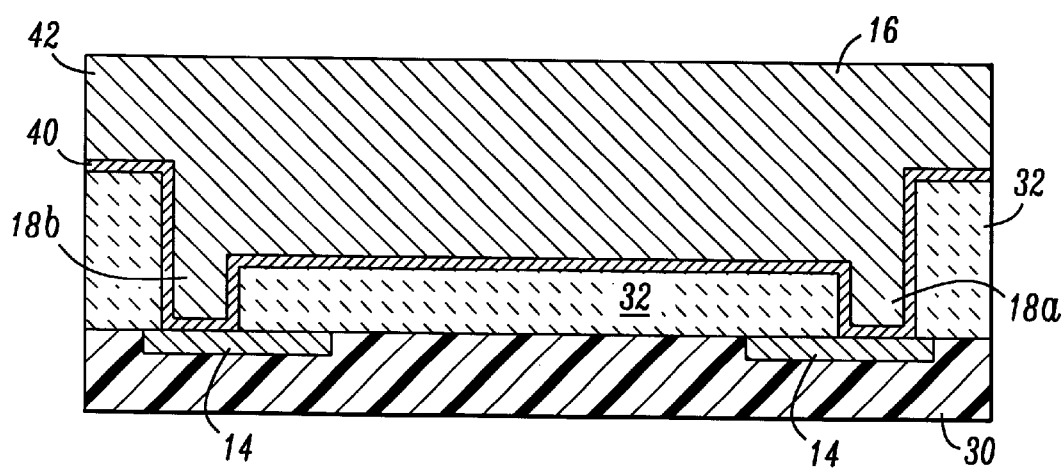

In a presently preferred embodiment of the invention, the side legs 18a, 18b and the top legs 16 are formed from copper using a damascene process. FIGS. 7 and 8 illustrate the preferred process for forming the side legs 18a, 18b and the top legs 16. If copper is to be used, a barrier layer 40 should be applied to exposed surfaces of the additional substrate layer 32 and the vias 36 to prevent migration of copper into the substrates 30, 32.

Many materials are capable of acting as a barrier between copper and the substrate to prevent the migration of copper across the barrier, and this invention is not limited to a particular material so capable. However, the presently preferred material for the barrier layer is tantalum (Ta), tantalum nitride (TaN), or a combination of both Ta and TaN. If formed from TaN, the barrier is not limited to a specific content of nitrogen in the TaN compound. Also, there can be a gradient in the content of nitride in the TaN compound within the barrier.

Methods of depositing a layer of Ta or TaN onto a substrate are well known in the art, and this invention is not limited as to a particular method of deposition. For example, processes such as sputtering or chemical vapor deposition (CVD) are commonly used to deposit layers of materials onto a substrate, and such methods are acceptable for use with this invention.

Once the barrier layer 40 has been formed, the copper can be applied using a damascene process to form the side legs 18a, 18b and the top legs 16. The damascene process is typically characterized as using a seed layer to start the electroplating process. Once this seed is established, the substrate is then placed in an electroplating bath and the thin film is formed from the seed.

Figure 9:
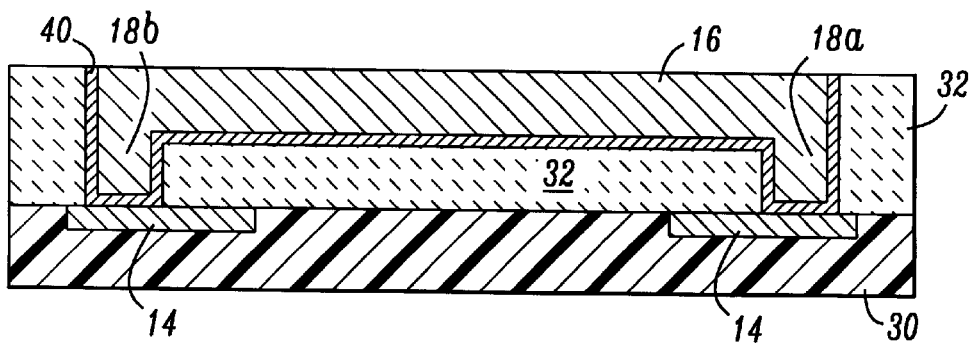

As illustrated in FIG. 9, upon application of the conductive material for the side legs 18a, 18b and the top legs 16, a material removal step is performed to remove excess conductive material from the additional substrate and the top legs 16. Many processes are well known in the art of semiconductor manufacturing that are capable of general material removal, and this invention is not limited as to a particular process. The presently preferred process of removing additional material is chemical/mechanical polishing.

It should be understood that the examples and embodiments described herein are for illustrative purposes only and that various modifications or changes in light thereof will be suggested to persons skilled in the art and are to be included within the spirit and purview of this application. The invention can take other specific forms without departing from the spirit or essential attributes thereof for an indication of the scope of the invention.

What is claimed is:

1. An inductor for a semiconductor device, comprising:

a plurality of first conductive elements located over a substrate;

a dielectric layer formed over the plurality of first conductive elements; and a plurality of integrally formed second conductive elements located within the dielectric layer and having first and second leg portions integrally formed with and joined by a bridge leg, the first and second leg portions serially connecting adjacent ones of the plurality of first conductive elements.

2. The inductor according to claim 1, wherein said first conductive elements comprise at least one selected from the group consisting of aluminum, copper, tungsten, doped polysilicon, and tungsten silicide.

3. The inductor according to claim 1, wherein said second conductive elements comprise at least one selected from the group consisting of aluminum, copper, tungsten, doped polysilicon, and tungsten silicide.

4. The inductor according to claim 1, further comprising a barrier layer, said barrier layer positioned between each one of said plurality of second conductive elements and a substrate layer.

5. The inductor according to claim 4, wherein said barrier layer is formed from at least one selected from the group consisting of tantalum and tantalum nitride.

* * * * *